United States Patent
Kuniyasu

(10) Patent No.: US 9,145,610 B2
(45) Date of Patent: Sep. 29, 2015

(54) METHOD FOR PRODUCING FILM WITH COATING

(71) Applicant: FUJIFILM Corporation, Minato-ku, Tokyo (JP)

(72) Inventor: Satoshi Kuniyasu, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/499,961

(22) Filed: Sep. 29, 2014

(65) Prior Publication Data

US 2015/0017347 A1 Jan. 15, 2015

Related U.S. Application Data

(63) Continuation of application No. PCT/JP2013/058685, filed on Mar. 26, 2013.

(30) Foreign Application Priority Data

Mar. 30, 2012 (JP) .................................. 2012-081703

(51) Int. Cl.
*C23C 16/48* (2006.01)
*C23C 16/22* (2006.01)
(Continued)

(52) U.S. Cl.
CPC .................. *C23C 16/482* (2013.01); *B05D 1/26* (2013.01); *B05D 3/0209* (2013.01); *B05D 7/04* (2013.01); *C08J 5/00* (2013.01); *C23C 16/22* (2013.01); *B05D 3/0254* (2013.01); *B05D 3/06* (2013.01); *B05D 7/50* (2013.01); *B05D 2252/02* (2013.01); *B05D 2350/60* (2013.01)

(58) Field of Classification Search
CPC .. B05D 1/26; B05D 2252/02; B05D 2350/60; B05D 3/0209; B05D 3/0254
See application file for complete search history.

(56) References Cited

U.S. PATENT DOCUMENTS

| | | | |
|---|---|---|---|
| 2007/0048531 A1* | 3/2007 | Nagaoka et al. ............... | 428/447 |
| 2011/0223357 A1 | 9/2011 | Umemori | |
| 2012/0004360 A1* | 1/2012 | Tomaru et al. ................ | 524/558 |

FOREIGN PATENT DOCUMENTS

| | | |
|---|---|---|
| JP | 03-174279 A | 7/1991 |
| JP | 2009-073901 A | 4/2009 |

(Continued)

OTHER PUBLICATIONS

International Search Report for PCT/JP2013/058685, dated Jul. 2, 2013.
Written Opinion for PCT/JP2013/058685, dated Jul. 2, 2013, 6 pages in Japanese and English.

*Primary Examiner* — Dah-Wei D Yuan
*Assistant Examiner* — Kristen A Dagenais
(74) *Attorney, Agent, or Firm* — Sughrue Mion, PLLC

(57) ABSTRACT

Even in the case where a coating liquid is applied onto an inorganic vapor-deposited film deposited on a support in advance, it is possible to effectively prevent cissing with a simple configuration and no increase in thickness of a product. A coating liquid preparation apparatus for preparing a coating liquid containing an actinic ray curable component, a coating apparatus for applying the coating liquid onto an inorganic vapor-deposited film deposited on a belt-like support in advance to form a coating, a first irradiation apparatus for irradiating the coating with an actinic ray, and a drying apparatus for drying the coating irradiated are provided in this order, and in the first irradiation apparatus, irradiation with an actinic ray is made in a state where the coating is wet, to place the curing rate of the curable component in the coating in a range of 10 to 80%.

4 Claims, 4 Drawing Sheets

(51) Int. Cl.
*B05D 1/26* (2006.01)
*B05D 7/04* (2006.01)
*C08J 5/00* (2006.01)
*B05D 3/06* (2006.01)
*B05D 7/00* (2006.01)
*B05D 3/02* (2006.01)

(56) References Cited

FOREIGN PATENT DOCUMENTS

| | | | |
|---|---|---|---|
| JP | 2009-074079 A | | 4/2009 |
| JP | 2009073901 A | * | 4/2009 |
| JP | 2011-190318 A | | 9/2011 |

* cited by examiner

FIG.4

| | CURING RATE OF CURABLE COMPONENT IN COATING AFTER UV IRRADIATION | RATING OF COATING MISSES |
|---|---|---|
| TEST 1 | 5 | MANY COATING MISSES |
| TEST 2 | 8 | COATING MISSES |
| TEST 3 | 10 | COATING MISSES BUT NO PROBLEM |
| TEST 4 | 30 | NO COATING MISSES |
| TEST 5 | 50 | NO COATING MISSES |
| TEST 6 | 70 | NO COATING MISSES |
| TEST 7 | 80 | NO COATING MISSES |
| TEST 8 | 90 | EXCESSIVELY CURED, AND THUS COATING PEELED | ns
METHOD FOR PRODUCING FILM WITH COATING

CROSS-REFERENCE TO RELATED APPLICATIONS

This application is a continuation application and claims the priority benefit under 35 U.S.C. §120 of PCT Application No. PCT/JP2013/058685 filed on Mar. 26, 2013 which application designates the U.S., and also claims the priority benefit under 35 U.S.C. §119 of Japanese Patent Application No. 2012-081703 filed on Mar. 30, 2012, which applications are all hereby incorporated by reference in its entireties.

BACKGROUND OF THE INVENTION

1. Field of the Invention

The present invention relates to a method for producing a film with a coating, and, in particular, relates to a method for producing a film with a coating, comprising a step of applying a coating liquid onto an inorganic vapor-deposited film deposited on a support in advance.

2. Description of the Related Art

A technique of applying a coating liquid onto a support to produce a film with a coating is widely used in the production field of a functional film such as an optical film.

When a coating liquid for forming a coating and a support have a relationship where they are easily repelling each other, or when the coating liquid and an underlayer formed on a support in advance have a relationship where they are easily repelling each other, however, there is the problem of easily causing coating misses.

Herein, cissing means the formation of small pin hole-shaped pores or depressions due to the fact that the coating liquid is partially repelled and not applied when the coating liquid is applied, or due to the fact that a coating thickness is small. These pore or depression portions are referred to coating misses (coating failure).

Causes for such a mutually easily repelling relationship include: a surface tension of the coating liquid is comparable to a surface free energy of the support; and the surface tension of the coating liquid is larger than the surface free energy of the support. When flowage due to the unevenness in surface tension (Marangoni convection) occurs, cissing more easily occurs as the coating thickness is larger.

When a disturbance such as variation in the surface free energy due to the variation in deposition thickness, is present in an inorganic vapor-deposited film formed as the underlayer, cissing more easily occurs as the coating thickness of the coating liquid applied onto the inorganic vapor-deposited film is thinner or a viscosity of the coating liquid is smaller.

Then, if coating miss portions are present in a functional film such as an optical film, the coating miss portions exert no functional performance and thus the functional film becomes defective.

As a measure for preventing cissing, the addition of a surfactant is generally known to be effective, but there is a problem that the function of a film may be adversely affected if the content of the surfactant is high.

As another measure for preventing cissing, there is a method of sandwiching an intermediate layer or an easily-adhesive layer having a high affinity between the coating and the support, or between the coating and the underlayer. As still another measure, there is a method of subjecting the support to a plasma treatment to improve an affinity of the support, as disclosed in Japanese Patent Application Laid-Open No. 2011-190318, for example.

SUMMARY OF THE INVENTION

However, sandwiching of an intermediate layer or an easily-adhesive layer between the underlayer formed by the inorganic vapor-deposited film and the coating, increases the thickness of the resultant film with the coating, and thus is contrary to the current tendency of thinned films with coating. In addition, the method of performing a plasma treatment onto the inorganic vapor-deposited film to improve affinity as described in Japanese Patent Application Laid-Open No. 2011-190318 requires a larger apparatus.

The conventional measures for preventing cissing thus have good and bad points, and therefore there is a demand for a measure for preventing cissing that can effectively prevent cissing for the inorganic vapor-deposited film with a simple configuration and no increase in thickness.

The present invention has been made in view of such circumstances, and provides a method for producing a film with a coating, which can effectively prevent cissing with a simple configuration and no increase in thickness of a product even in the case when a coating liquid is applied onto an inorganic vapor-deposited film deposited on a support in advance.

In order to solve the above problem, the method for producing a film with a coating of the present invention sequentially comprises a coating liquid preparation step of preparing a coating liquid containing an actinic ray curable component, an application step of applying the coating liquid onto an inorganic vapor-deposited film deposited on a support in advance to form a coating, a first irradiation step of irradiating the coating with an actinic ray, and a drying step of drying the irradiated coating. Here, in the first irradiation step, irradiation with the actinic ray is made in a state where the coating is wet, to place a curing rate of the curable component in the coating in a range of 10 to 80%.

Herein, the "state where the coating is wet" means a state where the coating includes 20% by mass or more of a solvent.

According to the present invention, the coating liquid contains the actinic ray curable component to thereby allow the curing reaction of the coating to progress in the state where the coating is wet, namely, while the coating liquid has fluidity, enabling to increase the viscosity of the coating. Specifically, irradiation with an actinic ray is performed in the state where the coating is in the wet state, to place the curing rate of the actinic ray curable component in the coating at 10% or more, thereby enabling to suppress cissing even in the case where the coating liquid is applied onto the inorganic vapor-deposited film which is easily repellent. In addition, if the curing rate is so high as to be more than 80%, there occurs the following larger problem than the problem of cissing: the coating is excessively cured to thereby result in an increase in curing shrinkage rate and the coating is peeled off from the support.

Accordingly, the curing rate of the actinic ray curable component in the coating can be placed in a range of 0 to 80% while the coating is in the wet state, to thereby effectively prevent cissing even in the case where the coating liquid is applied onto the inorganic vapor-deposited film deposited on the support in advance. Thus, a film with a coating with no coating misses can be produced. The curing rate is preferably in a range of 30 to 80%, and more preferably in a range of 40 to 80%.

In the method for producing a film with a coating of the present invention, preferably, the actinic ray curable component contains, in addition to an actinic ray curable monomer, an actinic ray curable resin having a molecular weight of 2500 or more at a solid content concentration of 3% by mass or more in the coating liquid, and contains the actinic ray curable resin and the actinic ray curable monomer at a total solid content concentration of 30% by mass or more.

Thus, the actinic ray curable resin having a molecular weight of 2500 or more is used as the actinic ray curable component, in addition to the actinic ray curable monomer, to thereby allow the curing reaction to further progress even when the coating is in the wet state, to enable to increase the viscosity of the coating, thereby more certainly preventing cissing.

In addition, the method for producing a film with a coating may further comprise a second irradiation step of irradiating the coating with an actinic ray to further cure the actinic ray curable component in the coating, after the coating is dried in the drying step.

In addition, in the method for producing a film with a coating, the drying step may also include a first drying step of drying the coating at an average evaporation rate of a solvent of 3.00 g/m²·sec or less for a period from when irradiation with an actinic ray in the first irradiation step is completed until when a solid content concentration of the coating reaches 80% of a solid content concentration at the start of decreasing rate drying, and a second drying step of subjecting the coating to drying for a substantially decreasing rate drying period from when the solid content concentration of the coating reaches more than 80% of the solid content concentration at the start of decreasing rate drying until when drying is completed, after the first drying step.

According to the method for producing a film with a coating of the present invention, it is possible to effectively prevent cissing with a simple configuration and with no increase in thickness of a product even in the case where the coating liquid is applied onto the inorganic vapor-deposited film deposited on the support in advance.

Accordingly, when a functional film such as an optical film is produced by the method for producing a film with a coating according to the present invention, a high-quality functional film having no functional defect can be produced.

BRIEF DESCRIPTION OF THE DRAWINGS

FIG. 4 is a table showing tests in Examples of the present invention.

DETAILED DESCRIPTION OF EMBODIMENTS

Figure 1:
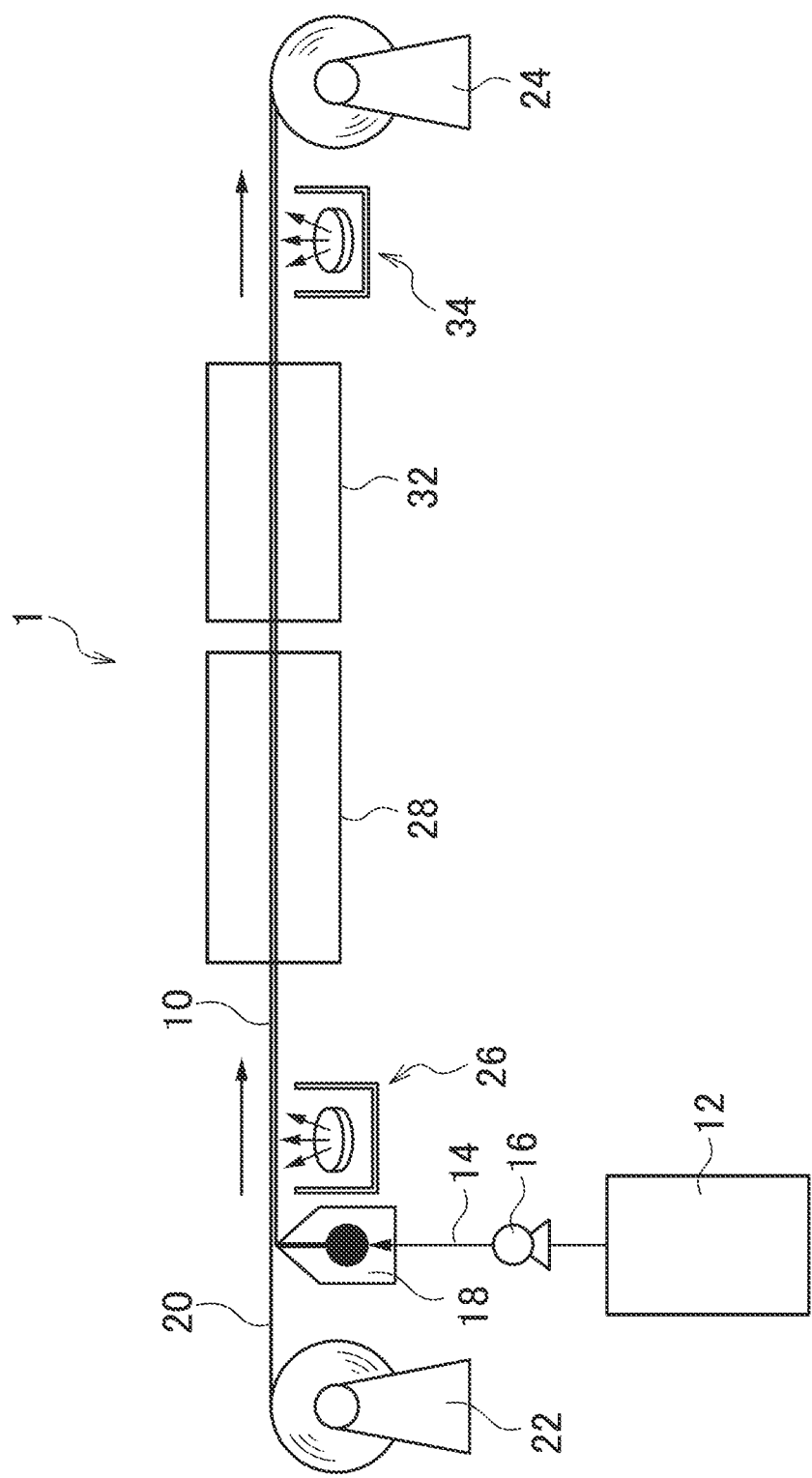
FIG. 1 is an overall configuration diagram of an apparatus for carrying out a method for producing a film with a coating of an embodiment of the present invention.

Hereinafter, an embodiment for carrying out the method for producing a film with a coating of the present invention is described in detail with reference to the accompanied drawings. In the drawings, herein, the portion designated by the same reference numeral is the same element having the same function. In the present description, when a numerical range is expressed using "to", the numerical values of the upper limit and the lower limit expressed using "to" are also encompassed in the numerical range.

FIG. 1 is an overall configuration diagram of a production apparatus for carrying out a method for producing a film with a coating of an embodiment of the present invention.

(Coating Liquid Preparation Step)

In a coating liquid preparation apparatus 12 illustrated in FIG. 1, a coating liquid containing an actinic ray curable component is prepared. In the embodiment, an example where an actinic ray curable resin having a molecular weight of 2500 or more is used as the actinic ray curable component, in addition to the actinic ray curable monomer, is described.

That is, in the coating liquid preparation apparatus 12, a coating liquid containing the actinic ray curable resin having a molecular weight of 2500 or more, in addition to the actinic ray curable monomer, in a solvent is prepared. In this case, preferably, the composition of the coating liquid is adjusted so that the coating liquid contains 3% by mass or more of the actinic ray curable resin as a solid content concentration of in the coating liquid, and that the coating liquid contains 30% by mass or more of the actinic ray curable resin and the actinic ray curable monomer, as a total solid content concentration.

The solid content concentration (%) in the coating liquid is here expressed by $[A/(A+B)] \times 100$ when the mass of a solid content is designated as A and the mass of a volatile component (solvent and the like) is designated as B.

As the solvent of the coating liquid, chloroform, methylene chloride, tetrahydrofuran, ethyl acetate, methyl acetate, methyl ethyl ketone, phenol, nitrobenzene, chlorophenol, chlorobenzene, hexafluoroisopropanol, and the like can be preferably used.

As the actinic ray curable monomer, for example, polyfunctional monomers, such as (meth)acrylic acid diesters of alkylene glycol, such as dipentaerythritol hexaacrylate, neopentylglycol acrylate, 1,6-hexanediol (meth)acrylate and propylene glycol di(meth)acrylate; (meth)acrylic acid diesters of polyoxyalkylene glycol, such as triethylene glycol di(meth)acrylate, dipropylene glycol di(meth)acrylate, polyethylene glycol di(meth)acrylate and polypropylene glycol di(meth)acrylate; (meth)acrylic acid diesters of polyhydric alcohol, such as pentaerythritol di(meth)acrylate; (meth)acrylic acid diesters of an ethylene oxide or propylene oxide adduct, such as 2,2-bis{4-(acryloxy diethoxy)phenyl}propane and 2,2-bis {4-(acryloxy polypropoxy)phenyl}propane; epoxy (meth)acrylates, urethane (meth)acrylates and polyester (meth)acrylates, and monofunctional monomers such as N-vinyl pyrrolidone, acrylic acid esters such as ethyl acrylate and propyl acrylate, methacrylic acid esters such as ethyl methacrylate, propyl methacrylate, isopropyl methacrylate, butyl methacrylate, hexyl methacrylate, isooctyl methacrylate, 2-hydroxyethyl methacrylate, cyclohexyl methacrylate and nonylphenyl methacrylate, tetrafurfuryl methacrylate and its derivatives such as a caprolactone-modified product thereof, styrene, α-methylstyrene, acrylic acid and the like, as well as mixtures thereof can be preferably used.

As the monomer, one type or a mixture of different types of the above-listed polyfunctional monomers and monofunctional monomers may be used. However, in order to increase the hardness of the coating, it is preferable that only polyfunctional monomer(s) may be used, or that a proportion of the polyfunctional monomer(s) may be adjusted to 80% by weight or more of an entire monomers used.

As the actinic ray curable resin, a monofunctional or polyfunctional acrylate, methacrylate, urethane acrylate or the like having a molecular weight of 2500 or more can be used. The actinic ray curable resin contained in the coating liquid may be composed of one type or composed of a plurality of actinic ray curable resins having a different molecular weight from each other. Herein, when an actinic ray curable resin having a molecular weight of 100000 or more is included. It is preferable that an actinic ray curable resin having a molecular weight of less than 100000 is also included and that the actinic ray curable resin having a molecular weight of less than 100000 is included in a higher weight proportion than that of the actinic ray curable resin having a molecular weight of 100000 or more. That is, with respect to the amounts of the actinic ray curable resin having a molecular weight of 100000 or more and the actinic ray curable resin having a molecular weight of less than 100000 in the coating liquid, it is more preferable that the amount of the actinic ray curable resin having a molecular weight of 100000 or more is smaller than 10% by mass of the amount of the actinic ray curable resin having a molecular weight of less than 100000, and it is even more preferable that the amount is smaller than 1% by mass of the amount of the actinic ray curable resin having a molecular weight of less than 100000, and most preferably, the actinic ray curable resin having a molecular weight of 100000 or more is not included. The reason for this is because, as the amount of the actinic ray curable resin having a molecular weight of 100000 or more is smaller, the hardness of the coating is more easily increased. In addition, the solid content concentration of the actinic ray curable monomer is preferably 1% by mass or more.

With respect to a polymerization initiator, a photo-radical polymerization initiator includes acetophenones, benzoins, benzophenones, phosphine oxides, ketals, anthraquinones, thioxanthones, an azo compound, peroxides (Japanese Patent Application Laid-Open No. 2001-139663 and the like), 2,3-dialkyldione compounds, disulfide compounds, fluoroamine compounds, aromatic sulfoniums, lophine dimers, onium salts, borate salts, active esters, active halogens, an inorganic complex and coumarins.

Herein, in the composition of the coating liquid, a component for exerting the intended function, an additive in a range not departing from the spirit of the present invention, and the like can be added in addition to the above actinic ray curable component.

Then, the coating liquid prepared in the coating liquid preparation apparatus 12 is fed to a coating apparatus 18 by a liquid feeding pump 16 via a piping 14.

(Application Step)

As illustrated in FIG. 1, a belt-like support 20 is fed out from a feeding apparatus 22 toward the coating apparatus 18. An inorganic vapor-deposited film is formed in advance on a surface of the belt-like support 20, onto which the coating liquid is to be applied.

The inorganic vapor-deposited film can include a thin film coating of a metal or an inorganic substance which is formed by depositing inorganic substance such as aluminum or silicon, or an oxide, nitride or oxynitride thereof or the like on the belt-like support 20. A transparent belt-like support 20 to be used including, but not particularly limited to, triacetylcellulose (TAC), polyethylene terephthalate (PET), and the like can be suitably used.

Then, in the coating apparatus 18, the coating liquid containing the actinic ray curable component prepared in the coating liquid preparation apparatus 12 is applied onto the inorganic vapor-deposited film. Thus, a coating 10 containing the actinic ray curable component is formed onto the inorganic vapor-deposited film formed on the belt-like support 20.

Herein, conveyance of the belt-like support 20 may be performed by a winding force of a winding apparatus 24, or a conveyance apparatus such as a feed roller, not illustrated, may be disposed on the way of a conveyance route. In addition, the coating apparatus 18 is illustrated as an extrusion type coating apparatus in FIG. 1, but not limited thereto. For example, various coating methods such as a gravure coating method, a roll coating method, a reverse coating method, a die coating method, a knife coating method, a wire bar coating method, a dip coating method, a spray coating method, an air knife coating method, a curtain coating method and the like can be adopted.

(First Irradiation Step)

Then, the belt-like support 20 on which the coating 10 is formed is conveyed to a first actinic ray irradiation apparatus 26, and the coating 10 is irradiated with an actinic ray while the coating 10 is in a wet state (in the state where 20% by mass or more of the solvent is contained).

According to this first irradiation step, the coating liquid can contain the actinic ray curable component to thereby allow a curing reaction to progress even in the state where the coating is in the wet state, increasing the viscosity of the coating.

In particular, in the embodiment, the coating liquid is prepared so as to have a composition where the actinic ray curable resin having a molecular weight of 2500 or more is contained at a solid content concentration of 3% by mass or more in the coating liquid, in addition to the actinic ray curable monomer, and where the actinic ray curable resin and the actinic ray curable monomer are contained at a total solid content concentration of 30% by mass or more. Thus, the curing reaction of the coating 10 can be further promoted even when the coating 10 is in the wet state. It is to be noted that the effect exerted by containing the actinic ray curable resin in addition to the actinic ray curable monomer in the first irradiation step is described later in detail.

Thus, irradiation with an actinic ray for a short time period increases the curing rate of the actinic ray curable component in the coating 10 to enable to increase the viscosity (viscosity) of the coating 10. In this case, if the curing rate is less than 10%, the viscosity is insufficient for preventing cissing, and it is necessary to place the curing rate at 10% or more. In addition, if the curing rate is more than 80%, there occurs the following more serious problem than the problem of cissing: the coating 10 is excessively cured to thereby result in an increase in curing shrinkage rate and the coating 10 is peeled off from the belt-like support 20.

Accordingly, in order to prevent cissing of the coating 10, it is necessary to irradiate the coating 10 with an actinic ray to allow the curing rate of the actinic ray curable component in the coating to be in a range from 10 to 80% in the state where the coating 10 is wet, namely, while the coating liquid can have fluidity to repair cissing. The curing rate is preferably in a range from 30 to 80% and more preferably, in a range from 40 to 80%.

In the first irradiation step by the first actinic ray irradiation apparatus 26, a semi-cured (partially cured) state is achieved by placing the curing rate of the actinic ray curable component in a range from 10 to 80% unlike a second irradiation step described later in which the curing reaction of the coating 10 is performed to the end to completely cure the coating 10.

The curing rate of the actinic ray curable component in the coating can be grasped by creating the calibration curve showing the relationship between the irradiation time period and the amount of the unpolymerized actinic ray curable component remaining in the coating under predetermined irradiation conditions (irradiance, amount of irradiation, and the like) by a preliminary test or the like in advance. In addition, the curing rate can also be quantitatively measured in measurement of transmitted light by Fourier transform infrared spectrophotometer (FT-IR). That is, the curing rate can be determined by interpolation from the absorbance when curing is at 0% and that at 100% in the peak at about 810 cm$^{-1}$ shown by a double bond.

When UV light is used as an actinic ray, the coating is preferably irradiated with UV light at an irradiance of 10 mW/cm$^2$ or more, and in an amount of irradiation of 10 mJ/cm$^2$ or more.

In the first irradiation step, it is necessary to irradiate the coating 10 in the wet state, including the solvent, with an actinic ray. Specifically, the coating 10 is preferably in the wet state where 20% by mass or more of the solvent is contained, further preferably 30% by mass or more, and particularly preferably 50% by mass or more. This is because cissing cannot be prevented when a coating 10 in a too dried state is irradiated with an actinic ray.

As an actinic ray, an ultraviolet ray (UV light), an electromagnetic ray, a particle beam, or the like can be used, and it is preferable to use an ultraviolet ray. As a light source for irradiation with an ultraviolet ray, various commercially available ultraviolet ray irradiation sources such as a low-pressure mercury lamp, a high-pressure mercury lamp and an ultrahigh-pressure mercury lamp can be adopted, and it is preferable to use an LED light source. The reason for this is because the LED light source is of a single wavelength and generates no heat by infrared light, and therefore a solvent gas evaporated from the coating can be prevented from igniting or catching fire due to heat.

In addition, it is preferable to perform the first irradiation step in an inert gas atmosphere. The reason for this is because oxygen absorbs ultraviolet ray energy to be changed to ozone under an atmosphere in which oxygen is present, and therefore the ultraviolet ray energy cannot be efficiently transmitted to the polymerization initiator. For the same reason, it is preferably to remove oxygen from the coating liquid before the application step. Accordingly, it is preferable to provide a degassing step of degassing air in the coating liquid between the coating liquid preparation step and the application step. Thus, oxygen that absorbs the ultraviolet ray energy is removed from the coating liquid, and therefore the ultraviolet ray energy can be efficiently transmitted to the polymerization initiator. Herein, in order to remove oxygen from the coating liquid, a method of temporality placing the coating liquid in a reduced pressure environment can be adopted.

(First Drying Step)

Then, the belt-like support 20 in which the coating 10 is irradiated with an actinic ray is conveyed to a first drying apparatus 28, and the coating 10 is dried. In this first drying apparatus 28, it is preferable to perform drying, for a period from when irradiation with an actinic ray is completed until when the solid content concentration of the coating 10 reaches 80% of the solid content concentration at the start of decreasing rate drying, so that the average evaporation rate of the solvent evaporated from the coating 10 is 3.00 g/m$^2$·sec or less.

Figure 2:
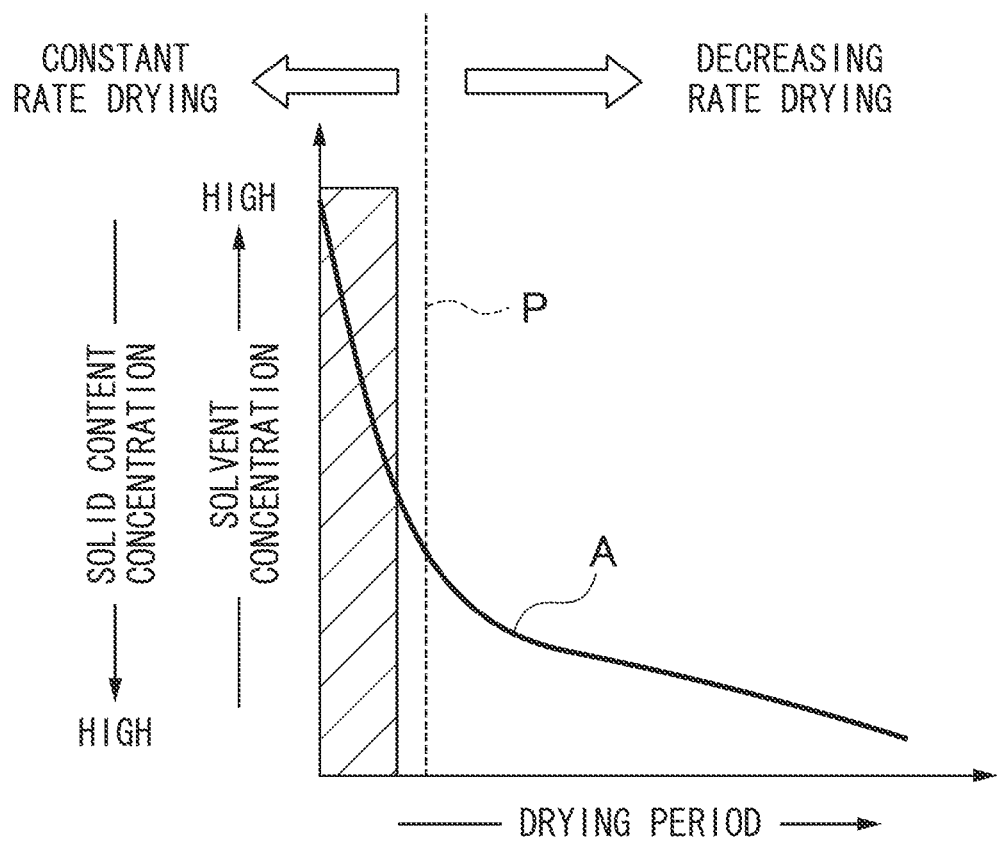
FIG. 2 is an illustration diagram of solid content concentrations in constant rate drying and decreasing rate drying.

FIG. 2 illustrates a drying curve A of the coating 10, wherein the horizontal axis represents the drying time and the vertical axis represents the solid content concentration in the coating or the solvent concentration in the coating. As illustrated in FIG. 2, the coating 10 is first subjected to constant rate drying and then to decreasing rate drying. The dashed line in FIG. 2 represents a transfer point P at which transfer from constant rate drying to decreasing rate drying is made, namely, a starting point of decreasing rate drying.

Then, in the first drying apparatus 28, drying in the shaded area in FIG. 2 corresponding to a period from when irradiation with an actinic ray is completed until when the solid content concentration of the coating 10 reaches 80% of the solid content concentration at the start of decreasing rate drying, is performed under a drying condition in which an average evaporation rate of the solvent is 3.00 g/m$^2$·sec or less.

For the constant rate drying period during which the solvent in the coating has a high content, the movement of the solvent in the coating 10 is sufficiently fast, and the solvent volatilizing from the surface of the coating 10 is sufficiently present. On the other hand, the coating 10 contains the actinic ray curable component to thereby increase the viscosity of the coating 10, and the removal (evaporation) of the solvent of the coating 10 during drying is decreased. In the embodiment, however, the average evaporation rate of the solvent is allowed to be 3.00 g/m$^2$·sec or less for a period from when irradiation with an actinic ray is completed until when the solid content concentration of the coating 10 reaches 80% of the solid content concentration at the start of decreasing rate drying, thereby enabling to perform drying so that the variation in surface tension is not caused in the coating 10. Thus, no fine irregularity (convex-concave) occurs on the surface of the coating, and thus a whitening phenomenon where light is scattered by fine irregularity on the surface of the coating 10 to allow the coating 10 to look white can be prevented.

Herein, when the coating 10 is dried, the temperature on the surface of the coating, which is a wet-bulb temperature, is raised rapidly at the transfer point P at which transfer from constant rate drying period to decreasing rate drying period is made. Accordingly, the transfer from constant rate drying period to decreasing rate drying period can be determined by measuring the temperature on the surface of the coating. In addition, the transfer from constant rate drying period to decreasing rate drying period can also be determined by a preliminary test or the like in which a strip having a predetermined size is cut out from the belt-like support 20 and is placed on a balance, and then the rate of change in mass of the strip is measured when it is dried. Accordingly, a drying curve A in FIG. 2 can be created by a preliminary test or the like in advance, to grasp the drying period until the solid content concentration of the coating reaches 80% of the solid content concentration at the start of decreasing rate drying.

(Second Drying Step)

Then, the belt-like support 20, in which the drying of the coating is completed in the first drying apparatus 28, is conveyed to a second drying apparatus 32, and drying for a substantially decreasing rate drying period from when the solid content concentration of the coating is more than 80% of the solid content concentration at the start of decreasing rate drying until when the drying is completed is performed. The drying of the coating 10 in this decreasing rate drying period may be performed at a usual drying speed in order to increase drying efficiency. There is no need to perform the above-described slow drying in which the average evaporation rate is 3.00 g/m$^2$·sec or less. Specifically, the drying may be performed under the condition where the average evaporation rate of the solvent evaporated from the coating is more than 3.00 g/m$^2$·sec.

During the decreasing rate drying period, the amount of the solvent in the coating 10 is small and the amount of the solvent volatizing from the surface of the coating 10 is small, and thus the coating is not whitened even if the coating 10 is dried under the usual drying condition described above.

(Second Irradiation Step)

Then, the belt-like support 20, in which the coating 10 is rapidly dried in the second drying apparatus 32, is conveyed to a second actinic ray irradiation apparatus 34, and the curing reaction of the coating 10 is performed to the end.

A film with a coating, produced by the above steps, is wound by a winding apparatus 24. Thus, a film with a coating, in which the coating 10 (for example, hard coating layer) is formed on the inorganic vapor-deposited film on the belt-like support 20, is produced.

<Effect Exerted by Containing Actinic Ray Curable Resin in Coating Liquid>

A mechanism is described below, in which the actinic ray curable resin as the curable component is contained in the coating liquid, in addition to the actinic ray curable monomer, thereby making the curing reaction of the coating 10 to rapidly progress by irradiation with an actinic ray even if the coating 10 is in the wet state.

Figure 3A:
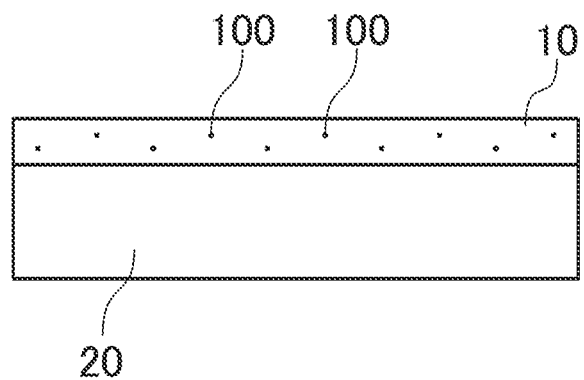
FIG. 3A is a mechanism illustration diagram (1) of a curing reaction in which an actinic ray curable resin is contained in a coating liquid in an embodiment.
Figure 3B:
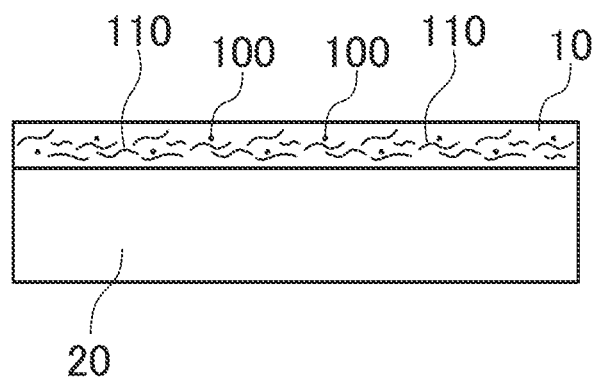
FIG. 3B is a mechanism illustration diagram (2) of a curing reaction in which an actinic ray curable resin is contained in a coating liquid in the embodiment.

FIGS. 3A and 3B are illustration diagrams for describing the states of the actinic ray curable monomer and the actinic ray curable resin in the coating 10. FIG. 3A is a diagram illustrating the state where only an actinic ray curable monomer 100 is present in the coating 10.

As illustrated in FIG. 3A, the actinic ray curable monomer 100 has a short molecular chain because of being a monomer. Therefore, when applied at a concentration in which a film can be produced, the actinic ray curable monomer 100 is present with mutually dispersed in the solvent because the solvent is present, and crosslinking points are physically separated, as illustrated in FIG. 3A. As a result, polymerization does not progress even if irradiation with an actinic ray is made to activate the actinic ray curable monomer. On the other hand, if the concentration of the actinic ray curable monomer 100 is made higher to thereby bring crosslinking points close to each other, the viscosity of the coating liquid is made so high that application is difficult.

FIG. 3B illustrates the state where a coating liquid containing an actinic ray curable resin 110 is applied to the belt-like support 20. As can be seen from FIG. 3B, the actinic ray curable resin 110 is made of a long molecule even at a low concentration, and thus can be brought into contact with other crosslinking point of the actinic ray curable resin 110, or other crosslinking point of the actinic ray curable monomer 100. Therefore, irradiation with an actinic ray can allow the actinic ray curable resin 110 and the actinic ray curable monomer 100 to be polymerized in a short time, and rapidly increase the curing rate of the coating 10 to 10% or more.

As a result, even if the solvent is present in the coating 10 in a large amount, for example, 40% by mass or more as in the case immediately after application, the curing reaction of the coating 10 can rapidly progress by irradiation with an actinic ray. As described above, it is thus possible to place the curing rate of the actinic ray curable component at 10% or more immediately after the coating liquid is applied onto the inorganic vapor-deposited film, increase the viscosity of the coating 10, and thereby prevent cissing without fail.

It is found from the foregoing that the same mechanism functions regardless of the type of an actinic ray for curing the actinic ray curable resin and the actinic ray curable monomer, and regardless of the type of the actinic ray curable resin and the actinic ray curable monomer themselves.

EXAMPLES

In the production of a film with a coating of the present invention by applying the coating for one layer onto the inorganic vapor-deposited film formed on the belt-like support 20, the coating misses due to cissing were examined in the conditions of satisfying the production condition of a film with a coating of the present invention and not satisfying it. In the Examples, a case where the actinic ray curable resin having a molecular weight of 2500 or more was used as the actinic ray curable component, in addition to an actinic ray curable monomer, was also adopted.

(1) Belt-Like Support

A polyester film (A4300 produced by Toyobo Co., Ltd., thickness: 100 μm) was used as the belt-like support 20, and an alumina-deposited film was used as the inorganic vapor-deposited film formed on the belt-like support 20.

(2) Coating Liquid Preparation Step

A coating liquid having the following composition was prepared.

| | |
|---|---|
| Solvent (mixed liquid with ratio of 1:1 between methyl ethyl ketone and methyl acetate) | 50% by mass |
| UV curing monomer (PET-30 produced by Nippon Kayaku Co., Ltd.) | 23.5% by mass |
| UV curing resin (urethane acrylate) | 23.5% by mass |
| Polymerization initiator (Irgacure 369 produced by BASF) | 3% by mass |

(3) Application Step

The coating liquid prepared was applied onto the inorganic vapor-deposited film by using an extrusion type die coater. The application was performed so that the amount of wet application was 15 cc/m$^2$, while the belt-like support 20 was conveyed at a conveyance speed of 30 m/min.

(4) First Irradiation Step

The first irradiation step was performed under the irradiation conditions of: the coating applied in the application step being in the wet state (in the state of 50%); an UV irradiance of 0.5 W/cm$^2$; and an amount of UV irradiation of 0.02 J/cm$^2$. Then, the irradiation time period was changed to thereby allow the curing rate of the actinic ray curable component in the coating after UV irradiation to change in a range from 5% to 90% in eight stages (see FIG. 4).

(5) Drying Step

The first drying step was performed at an average evaporation rate of 3.00 g/m$^2$·sec at which the solvent in the coating was evaporated, for a period from when irradiation with an actinic ray in the first irradiation step was completed until when the solid content concentration of the coating 10 reached 80% of the solid content concentration at the start of decreasing rate drying.

(6) Second Irradiation Step

In the second irradiation step, irradiation of the coating 10 after the drying was performed under the irradiation conditions of an UV irradiance of 0.5 W/cm$^2$ and an amount of UV irradiation of 0.3 J/cm$^2$. Herein, an UV irradiation apparatus [OX224 manufactured by Sentec Corp.] with an LED was used for UV irradiation in both of the first and second irradiation steps.

A film with a coating was produced by steps (1) to (6) above.

(7) Evaluation Method of Coating Misses

Eight samples of films with a coating were produced under conditions where the curing rates of Tests 1 to 8 were achieved in the first irradiation step, and the presence or absence of coating misses in each of the films with a coating was visually observed with light-irradiation from the surface of the belt-like support 20 side.

(8) Test Results

The test results are shown in Table of FIG. 4.

As can be seen from Table of FIG. 4, coating misses were clearly observed in a film with a coating having a curing rate of 5% and a film with a coating having a curing rate of 8% in the first irradiation step. Then, when the curing rate in the first irradiation step was increased to 10%, coating misses were decreased to such an extent that no problem occurred as an optical film. When the curing rate was further increased to 30%, no coating misses were observed at all and the same good result was achieved until the curing rate reached 80%. When the curing rate was increased to 90%, however, the coating 10 was excessively cured to have a high curing shrinkage rate, and the coating 10 was peeled from the inorganic vapor-deposited film.

From this result, cissing could be effectively suppressed in the first irradiation step by irradiating the coating 10 in the wet state with an actinic ray to increase the curing rate of the curable component in the coating by 10 to 80%, even in the case of application of the coating liquid onto the inorganic vapor-deposited film deposited on the belt-like support 20 in advance.

What is claimed is:

1. A method for producing a film with a coating, sequentially comprising:
    a coating liquid preparation step of preparing a coating liquid containing an actinic ray curable component;
    an application step of applying the coating liquid onto an inorganic vapor-deposited film deposited on a support in advance to form a coating;
    a first irradiation step of irradiating the coating with an actinic ray; and
    a drying step of drying the irradiated coating,
    wherein in the first irradiation step, irradiation with the actinic ray is made in a state where the coating is wet to partially cure the actinic ray curable component in the coating in a range of 10 to 80%.

2. The method for producing a film with a coating according to claim 1, wherein
    the actinic ray curable component contains, in addition to an actinic ray curable monomer, an actinic ray curable resin having a molecular weight of 2500 or more at a solid content concentration of 3% by mass or more in the coating liquid, and contains the actinic ray curable resin and the actinic ray curable monomer at a total solid content concentration of 30% by mass or more.

3. The method for producing a film with a coating according to claim 1, further comprising
    a second irradiation step of irradiating the coating with an actinic ray to further cure the actinic ray curable component in the coating, after the coating is dried in the drying step.

4. The method for producing a film with a coating according to claim 1, wherein
    the drying step comprises:
    a first drying step of drying the coating at an average evaporation rate of a solvent of 3.00 g/m$^2$·sec or less for a period from when irradiation with the actinic ray in the first irradiation step is completed until when a solid content concentration of the coating reaches 80% of a solid content concentration at the start of decreasing rate drying; and
    a second drying step of subjecting the coating to drying for a substantially decreasing rate drying period from when the solid content concentration of the coating reaches more than 80% of the solid content concentration at the start of decreasing rate drying until when drying is completed, after the first drying step.

* * * * *